(12) United States Patent
Chang et al.

(10) Patent No.: US 7,972,878 B2
(45) Date of Patent: Jul. 5, 2011

(54) QUANTUM DOT MEMORY

(75) Inventors: Yia-Chung Chang, Taipei (TW); David M T Kuo, Taoyuan (TW)

(73) Assignee: Academia Sinica, Taipei (TW)

( * ) Notice: Subject to any disclaimer, the term of this patent is extended or adjusted under 35 U.S.C. 154(b) by 62 days.

(21) Appl. No.: 12/478,084

(22) Filed: Jun. 4, 2009

(65) Prior Publication Data

US 2010/0308303 A1 Dec. 9, 2010

(51) Int. Cl.
*H01L 21/00* (2006.01)
*H01L 29/76* (2006.01)

(52) U.S. Cl. .................. 438/29; 257/288; 257/E29.255; 438/962; 438/45

(58) Field of Classification Search .................. 257/288, 257/314, E29.255; 438/29, 45, 46, 47, 962
See application file for complete search history.

(56) References Cited

U.S. PATENT DOCUMENTS

| | | | |
|---|---|---|---|
| 5,923,046 A | 7/1999 | Tezuka et al. | |
| 2009/0184346 A1* | 7/2009 | Jain | 257/314 |

OTHER PUBLICATIONS

Goldman, V.J. and D.C. Tsui. "Observation of Intrinsic Bistability in Resonant-Tunneling Structures," Physical Review Letters, 58(12): 1256-1259 (1987).
Egger et al., "Current Bistability and Hysteresis in Strongly Correlated Quantum Wires," Physical Review Letters, 84(16): 3682-3685 (2000).
Ouyang et al., "Programmable Polymer Thin Film and Non-Volatile Memory Device," Natural Materials, 3:918-922 (2004).

Alexandrov, A.S., and A.M. Bratkovsky, "Memory Effect in a Molecular Quantum Dot with Strong Electron-Vibron Interaction," Physical Review, B 67: 235312-1-235312-8 (2003).
Galperin et al., "Hysteresis, Switching, and Negative Differential Resistance in Molecular Junctions: A Polaron Model," Nano Letters, 5(1): 125-130 (2005).
La Magna, Antonio, and Ioannis Deretzis, "Phonon Driven Nonlinear Electrical Behavior in Molecular Devices," Physical Review Letters, 99:136404-1-136404-4 (2007).
Yu et al., "Coupling Induced Subband Structures and Collective Single Electron Behavior in a Sincle Layer Si Quantum Dot Array," Journal of Applied Physics, 100:083701-1-083701-5 (2006).
Shibata et al., "Novel Nonvolatile Random-Access Memory with Si Nanocrystals for UltralowPower Scheme," Jpn. J. Appl. Phys. 42:2387-2390 (2003).
Ruda, H.E. and Bi Qiao, "Modeling and Prospects for a Solid-State Quantum Computer," Proceedings of the IEEE, 91(11):1874-1883 (2003).
Cooke, Mike, "Flash Fast Forward to Quantum Dot Memory," Compounds and Advanced Silicon 3(5):45-49 (2008).
Prada, M. and P. Harrison, "Geometrical Effects on the Charge/Discharge of Quantum Dot Flash Memories," Superlattices and Microstructures, 34:241-244 (2003).

* cited by examiner

*Primary Examiner* — Walter L Lindsay, Jr.
(74) *Attorney, Agent, or Firm* — Occhiuti Rohlicek & Tsao LLP

(57) ABSTRACT

A method of making a quantum dot memory cell, the quantum dot memory cell including an array of quantum dots disposed between a first electrode and a second electrode, includes obtaining values for a tunneling current through the quantum dot memory cell as a function of a voltage applied to the quantum dot memory cell and selecting parameters of the quantum dot memory cell such that the tunneling current through the quantum dot memory cell exhibits a bistable current for at least some values of the voltage applied to the quantum dot memory cell. The values for the tunneling current are determined on the basis of a density of states of the array of quantum dots.

29 Claims, 6 Drawing Sheets

QUANTUM DOT MEMORY

FIELD OF THE INVENTION

This invention relates to a quantum dot memory.

BACKGROUND

Resonant tunneling diodes (RTDs) are used as memory devices due to the bistable behavior that results from a hysteresis intrinsic to the DC current-voltage characteristics of the RTDs. This bistability is predicted to exist in nanoscale devices such as single electron transistors and single molecule transistors. Tunneling current through degenerate states of a single quantum dot or molecule leads to a switching effect only in the case of an attractive electron-electron interaction which is mediated by the electron-phonon interaction. It has been proposed, considering only a single energy level, that the hysteresis of I-V characteristics can be observed in a single molecule junction with an effective attractive Coulomb interaction on the basis of the Hartree approximation and the polaron effect. Hysteretic tunneling current in a polaron model has also been observed beyond the Hartree approximation.

Theoretical studies have predicted the existence of hysteresis in a quantum dot or molecular junction, although conclusive experimental support for the predictions has not been achieved. The tunneling current through a carbon nanotube quantum dot exhibits a periodic oscillatory behavior with respect to an applied gate voltage, which arises from an eightfold degenerate state. A periodic oscillatory differential conductance also arises as a result of a tunneling current through a single spherical PbSe quantum dot having a sixfold degenerate state. However, neither of these situations exhibits a bistable tunneling current, indicating that electron-phonon interactions in nanotube quantum dots and PbS quantum dots are not sufficient to yield the strong effective electron-electron interactions necessary for the existence of a bistability. In general, bistable current in existing memory systems arises from a phase transition of a bulk material, which phase transition vanishes on the nanoscale.

Semiconductor quantum dot arrays can be chemically fabricated to form a superlattice. The size of the quantum dots and the lattice constant of the superlattice are controllable via nanoscale manipulation, enabling charges in the quantum dot array to be tuned in either the Coulomb blockade regime or the semiconducting regime. Consequently, quantum dot arrays are promising candidates for the investigation of strongly correlated systems as well as for use as integrated electronic devices.

SUMMARY

In a general aspect, a method of making a quantum dot memory cell, the quantum dot memory cell including an array of quantum dots disposed between a first electrode and a second electrode, includes obtaining values for a tunneling current through the quantum dot memory cell as a function of a voltage applied to the quantum dot memory cell and selecting parameters of the quantum dot memory cell such that the tunneling current through the quantum dot memory cell exhibits a bistable current for at least some values of the voltage applied to the quantum dot memory cell. The values for the tunneling current are determined on the basis of a density of states of the array of quantum dots.

Embodiments may include one or more of the following. The quantum dot memory cell includes a quantum well positioned between the array of quantum dots and the first electrode. The values for the tunneling current are obtained on the basis of an occupation number of the quantum well, the occupation number of the quantum well representing a number of electrons in a subband of the quantum well.

The values for the tunneling current are obtained on the basis of a first tunneling rate between the array of quantum dots and the first electrode and a second tunneling rate between the array of quantum dots and the second electrode. The values for the tunneling current are obtained on the basis of a first Fermi distribution function of the first electrode and a second Fermi distribution function of the second electrode. The values for the tunneling current are obtained on the basis of a first occupation number of the array of quantum dots, the first occupation number representing a number of electrons in orbitals coupling the quantum dots to the first electrode and the second electrode. The orbitals coupling the quantum dots to the first electrode and the second electrode are localized around each quantum dot. The values for the tunneling current are obtained on the basis of a second occupation number of the array of quantum dots, the second occupation number representing a number of electrons in one of a plurality of energy levels in extended states of the array of quantum dots.

The parameters include one or more of the following: a composition of the quantum dots, a separation between adjacent quantum dots in the array of quantum dots, a size of the quantum dots, a number of quantum dots in the array of quantum dots, a composition of a material in which the array of quantum dots is embedded, a composition of the first electrode and a composition of the second electrode, a composition of the quantum well.

The tunneling current arises at least in part due to charge swapping between localized states in the array of quantum dots and extended states in at least one of the first electrode and the second electrode. The quantum dot memory cell exhibits bistable current when the voltage applied to the quantum dot memory cell is less than about 100 mV. The quantum dot memory cell is capable of operating with a switching speed of about 1 Terahertz.

In another aspect, a quantum dot memory cell includes a first electrode, a second electrode, and an array of quantum dots disposed between the first electrode and the second electrode. Parameters of the quantum dot memory cell are selected such that a tunneling current through the quantum dot memory cell exhibits a bistable current for at least some values of a voltage applied across the quantum dot memory cell, the tunneling current determined on the basis of a density of states of the array of quantum dots.

Embodiments may include one or more of the following. The quantum dot memory cell includes a quantum well positioned between the array of quantum dots and the first electrode. The array of quantum dots includes at least 50 quantum dots. The array of quantum dots includes a single layer of quantum dots in substantially all regions of the array of quantum dots. The array of quantum dots is substantially two-dimensional. The array of quantum dots is substantially one-dimensional.

The tunneling current arises at least in part due to charge swapping between localized states in the array of quantum dots and extended states in at least one of the first electrode and the second electrode. The quantum dot memory cell exhibits bistable current when the voltage applied to the quantum dot memory cell is less than about 100 mV. The quantum dot memory cell is capable of operating with a switching speed of about 1 Terahertz. The quantum dots include a semiconductor. The quantum well includes a semiconductor.

A quantum dot memory cell as described herein has a number of advantages, including the following. Bistable states of such a quantum dot memory cell are used as a nanoscale memory operable at room temperature; a bistable current response of the memory cell is used to read out information stored in the nanoscale memory. For instance, such a quantum dot memory cell has low power consumption and is capable of operating with an applied bias of less than 100 mV. Due to the quantum nature of the memory cell, the switching time is comparable to the tunneling rate through the quantum dots in the memory cell, which is on the order of a picosecond. Thus, a memory clock rate on the order of 1 THz is attainable. Additionally, a quantum dot memory cell as described herein has a storage density as high as about 1 TB/in$^2$, which is significantly higher than the storage density of existing non-volatile memory devices. Furthermore, a nanoscale memory composed of multiple quantum dots does not encounter problems related to background charge, which problem significantly limits the applications of single electron transistors and molecular transistors.

DETAILED DESCRIPTION

Figure 1A:
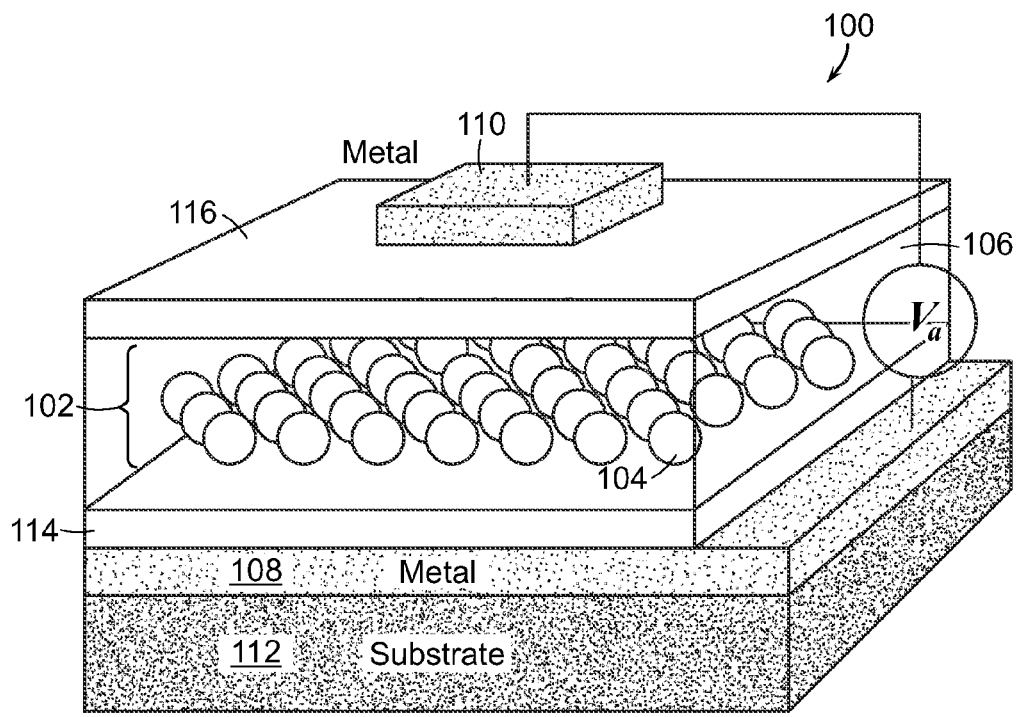
FIG. 1A depicts a quantum dot memory cell.

Referring to FIG. 1A, a quantum dot memory cell 100 has a nanoscale memory structure capable of high density storage that operates on the basis of electronic interactions among quantum dots in the memory cell. Quantum dot memory cell 100 includes an array 102 of quantum dots 104 embedded in an insulator matrix layer 106, which is positioned between a bottom electrode 108 and a top electrode 110, both of which are metals such as copper. Bottom electrode 108 sits on a substrate 112, which is made of, for instance, silicon. A bias $V_a$ is applied across quantum dot memory cell 100; insulator layer 106 containing the array 102 of quantum dots 104 acts as a tunneling barrier between bottom electrode 108 and top electrode 110.

In some embodiments, the material of insulator matrix layer 106 embeds quantum dots 104 but is not capable of forming a good quality connection with bottom electrode 108 and top electrode 110. In this situation, a first insulating spacer layer 114 is positioned between insulator matrix layer 106 and bottom electrode 108 and a second insulating spacer layer 114 is positioned between insulator matrix layer 106 and top electrode 110. The material of first and second insulating spacer layers 114 and 116 is chosen to form a smooth connection with bottom and top electrodes 108, 110.

Quantum dots 104 may be composed of any semiconductor material, including but not limited to GaAs, InAs, and CdSe. In some examples, quantum dots 104 have a radius of around 2-3 nm such that only one localized electronic state exists in each quantum dot. In other examples, quantum dots 104 are large enough to each support multiple localized electronic states. The quantum dots preferably have a shape that is approximately spherical. Quantum dots 104 in array 102 are separated from each other by a distance that is sufficiently short so as to allow electronic states of adjacent dots to electronically couple. For instance, in some embodiments quantum dots 104 are separated by about 1-2 nm, or by less than about 3 nm. The degree of coupling between quantum dots 104 is also affected by the size and composition of quantum dots 104 and the dielectric constant of insulator matrix layer 106, among other parameters.

Figure 1B:
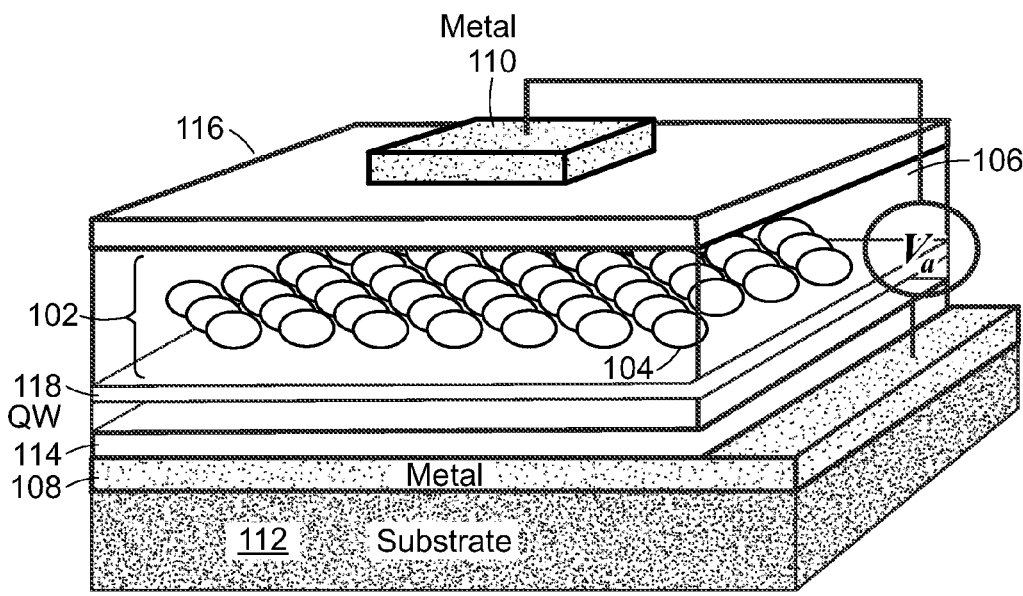
FIG. 1B depicts another embodiment of a quantum dot memory cell.

Referring to FIG. 1B, in another embodiment, a quantum dot memory cell 150 includes a quantum well 118. Quantum well 118 is positioned between insulator matrix layer 106 and first insulating spacer layer 114, as shown, or between insulator matrix layer 106 and second insulating spacer layer 116. Quantum well 118 is made of a semiconductor material, such as GaAs or any other semiconductor commonly used for quantum wells.

Figure 2A:
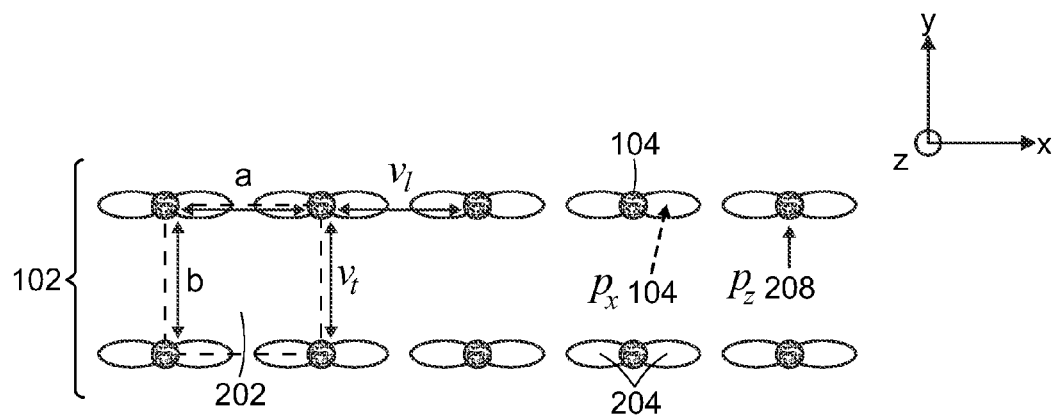
FIGS. 2A, 2B, and 2C depict an array of quantum dots.

Array 102 of quantum dots 104 is formed by any standard method of quantum dot assembly. In some embodiments, array 102 is generated by self-assembly of previously synthesized quantum dots. For instance, array 102 is formed via a directed self-assembly process in which a grid is defined on bottom electrode 108 and quantum dots 104 are guided to self-assemble in the grid into array 102. In other embodiments, array 102 of quantum dots is formed directly on bottom electrode 108 by an epitaxy process (e.g., molecular beam epitaxy) or a chemical vapor deposition process. Referring to FIG. 2A, quantum dots 104 of array 102 are arranged in a lattice having a first lattice constant a along an x axis and a second lattice constant b along a y axis. A z axis projects out of the page of the figure. A unit cell of array 102 is defined on the basis of the arrangement of quantum dots 104 in array 102. In the array 102 shown in FIG. 2A, a unit cell 202 is defined such that a quantum dot 104 is located at each corner of the unit cell 202. In other arrangements of quantum dots in 104 in array 102, other unit cells may be defined. For instance, some arrangements of quantum dots 104 may be described by a unit cell having a quantum dot 104 at each corner of the unit cell and one quantum dot located in the center of the unit cell.

Figure 2B:
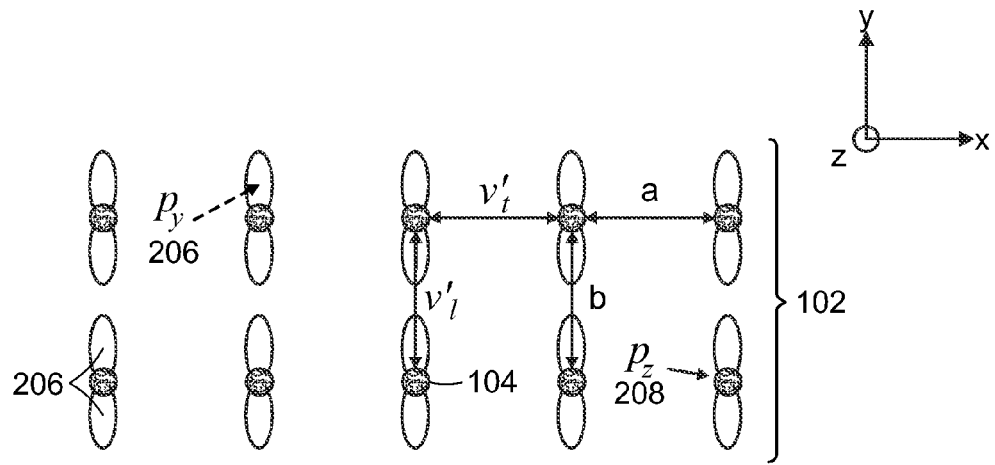
Figure 2C:
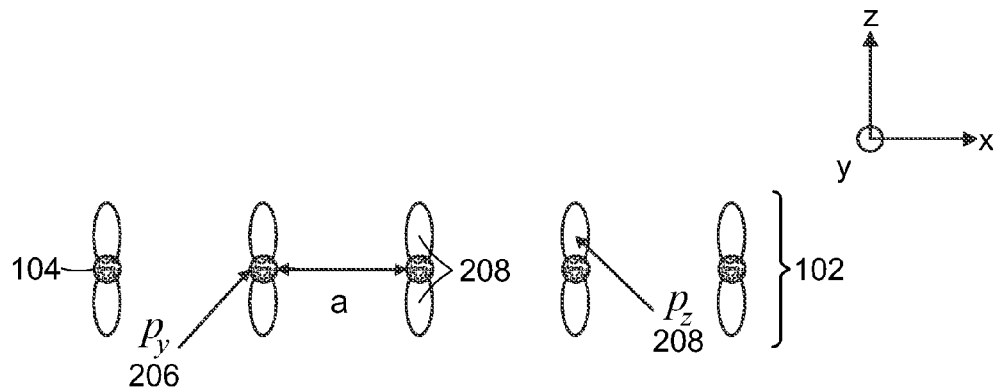

Referring to FIGS. 2A, 2B, and 2C, electronic states (i.e., orbitals) of quantum dots 104 are localized at each quantum dot in the array; electronic states in bottom electrode 108 and top electrode 110 are extended throughout each electrode. FIGS. 2A and 2B show array 102 of quantum dots in the x-y plane; FIG. 2C shows array 102 of quantum dots in the x-z plane. Each quantum dot 104 has a pair of $p_x$ orbitals 204 oriented along the x axis, a pair of $p_y$ orbitals 206 oriented along the y axis, and a pair of $p_z$ orbitals 208 oriented along the z axis. $p_x$ orbitals 204, $p_y$ orbitals 206, and $p_z$ orbitals 208 are six-fold degenerate prior to any coupling effect; i.e., all six orbitals have the same energy. An electron hopping between $p_x$ orbitals 204 of adjacent quantum dots 104 along the x axis has a hopping rate $v_l$; an electron hopping between $p_x$ orbitals 204 of adjacent quantum dots 104 along the y axis has a hopping rate $v_r$. An electron hopping between $p_y$ orbitals 206 of adjacent quantum dots 104 along the x axis has a hopping rate $\upsilon_t'$; an electron hopping between $p_y$ orbitals 206 of adjacent quantum dots 104 along the y axis has a hopping rate $\upsilon_t'$.

$p_x$ and $p_y$ orbitals 204, 206 (also called $p_{xy}$ orbitals) of adjacent quantum dots 104 overlap (i.e., hybridize) in the x-y plane, forming two-dimensional (2-D) conduction bands in array 102 of quantum dots 104. Array 102 includes a sufficient number of quantum dots 104 to form a band; in general, array 102 contains at least about 50-100 quantum dots. The separation between adjacent quantum dots 104 is small enough to allow coupling between $p_x$ and $p_y$ orbitals 204, 206. The height of a potential barrier between adjacent quantum dots also affects the degree of coupling between $p_x$ and $p_y$ orbitals 204, 206. For instance, for a potential barrier of 0.5 eV, coupling occurs between $p_x$ and $p_y$ orbitals of adjacent quantum dots having an interdot hopping energy of 20 meV when the quantum dots are separated by less than about 3 nm. In other instances, depending on factors such as the composition of quantum dots 104 and insulating matrix layer 106 and the temperature, coupling occurs between $p_x$ and $p_y$ orbitals of adjacent quantum dots separated by a distance of less than about 2 nm.

In the embodiment shown in FIG. 1B, extended band states exist in quantum well 118. In this case, $p_x$ and $p_y$ orbitals 204, 206 of adjacent quantum dots 104 do not need to overlap to form conduction bands in array 102. Thus, the spacing between adjacent quantum dots in array 102 is less critical. Charge neutrality in quantum dot memory cell 150 is maintained by having a sufficient quantity and areal density of quantum dots 104. Because the spacing between quantum dots does not need to be precisely controlled, quantum dot memory cell 150 including quantum well 118 is easier to fabricate than quantum dot memory cell 100.

$p_z$ orbitals 208 remain localized in the x-y plane at each quantum dot 104; that is, coupling between $p_z$ orbitals of neighboring quantum dots is negligible. If quantum dots 104 are positioned too close together, $p_z$ orbitals 208 of adjacent quantum dots may couple, destroying the localization of the $p_z$ orbitals. During operation of the quantum dot memory cell, $p_z$ orbitals 208 of quantum dots 104 couple electronically with the extended electronic states of bottom electrode 108 and top electrode 110 and with the 2-D conduction bands in array 102 via an on-site Coulomb interaction. In the example shown in FIG. 1B, $p_z$ orbitals 208 couple with the extended band or sub-band states of quantum well structure 118 rather than with the extended states of array 102 of quantum dots. The thickness and composition of quantum well 118 is designed such that the energy of a sub-band state of the quantum well is close to the energy of localized orbitals of quantum dots 104, which are not restricted to the $p_z$ orbitals 208. In this case, the existence of the $p_x$ and $p_y$ orbitals is not critical, and the shape of the quantum dots is not restricted to being approximately spherical.

An expression for the extended Anderson Hamiltonian, $H=H_0+H_T+H_d$, derived from a combination of the Falicov-Kimball model and the Anderson model, is used to mathematically describe quantum dot memory cell 100.

The first term of the extended Anderson Hamiltonian, $H_0$, describes electronic states in bottom electrode 108 and top electrode 110. $H_0$ is written as $$H_0 = \sum_{k,\sigma,\beta,\ell} \varepsilon_k a^\dagger_{k,\sigma,\beta} a_{k,\sigma,\beta},$$

where $\alpha_{k,\sigma,\beta}^\dagger$ ($\alpha_{k,\sigma,\beta}$) creates (destroys) an electron of wave vector k and spin σ having an energy $\in_k$ in the β electrode (i.e., in bottom electrode 108 or top electrode 110).

Referring to FIGS. 1, 2A, and 2B, the second term of the extended Anderson Hamiltonian, $H_T$, describes coupling between electronic states of bottom and top electrodes 108, 110 and $p_z$ orbitals 208 of quantum dots 104:

$$H_T = \sum_{k,\sigma,\beta,\ell} V_{k,\beta,\ell} a^\dagger_{k,\sigma,\beta} d_{\ell,\sigma} + \sum_{k,\sigma,\beta,\ell} V^*_{k,\beta,\ell} d^\dagger_{\ell,\sigma} a_{k,\sigma,\beta}, \quad (1)$$

where $d_{l,\sigma}^\dagger$ ($d_{l,\sigma}$) creates (destroys) an electron with spin σ in the $p_z$ orbital 208 of a particular quantum dot 104 located at a site l in array 102 and $V_{k,\beta,l}$ describes the coupling between continuous electronic states in bottom and top electrodes 108, 110 and $p_z$ orbitals 208 of quantum dots 104. In the expression for $H_T$, it is assumed that the coupling between the bottom and top electrodes 108, 110 and the $p_{xy}$ orbitals 204, 206 of array 102 of quantum dots 104 is negligible because $p_{xy}$ orbitals 204, 206 are localized along the z axis.

The third term of the extended Anderson Hamiltonian, $H_d$, describes interactions among electronic states of quantum dots 104 in array 102:

$$H_d = \sum_{\ell,\sigma} E_{p_z} d^\dagger_{\ell,\sigma} d_{\ell,\sigma} + \sum_{p,\lambda} (\varepsilon_{p,\lambda} + U(N_c - N_\lambda)) c^\dagger_{p,\lambda} c_{p,\lambda} + \sum_\ell U_\ell d^\dagger_{\ell,\sigma} d_{\ell,\sigma} d^\dagger_{\ell,-\sigma} d_{\ell,-\sigma} + \frac{U_{dc}}{N_{QD}} \sum_{\ell,p,p',\sigma} c^\dagger_{p,\lambda} c_{p',\lambda} e^{i(p-p') \cdot R_\ell} d^\dagger_{\ell,\sigma,\lambda} d_{\ell,\sigma}, \quad (2)$$

where $d_{l,\sigma}^\dagger$ ($d_{l,\sigma}$) creates (destroys) an electron in $p_z$ orbital 208 (having an energy $E_{pz}=E_P$) of a particular quantum dot 104 located at a site l in array 102 and $c_{p,\lambda}$ and $c_{p,\lambda}^\dagger$ represent creation and annihilation operators, respectively, of an electron having a wave vector p in a band λ of the 2-D conduction band of array 102. The second term of Eq. (2) describes 2-D conduction bands of array 102 arising from the coupling of $p_{xy}$ orbitals 204, 206 in array 102, where ρ labels 2-D wave vectors of array 102, $R_l$ denotes the position of a particular quantum dot 104 located at a site l in array 102, λ labels the conduction bands (including spin), and U denotes an on-site Coulomb interaction between two electrons in $p_{xy}$ orbitals 204, 206 of a quantum dot 104. Ignoring quadrupole and higher order terms in the expansion of $1/r_{12}$, the Coulomb repulsion integrals between two electrons in any of the three degenerate p-like orbitals 204, 206, 208 are the same. $N_\lambda$ is the occupation number per unit cell 202 for the λ-th conduction band of array 102, and $$N_c = \sum_\lambda N_\lambda$$

is the total occupation number per unit cell 202 in $p_{xy}$ orbitals 204, 206 forming the conduction bands of array 102. The second term of Eq. (2) is obtained using a mean-field theory (which is justified for extended states) applied to the 2-D conduction bands of array 102. The last two terms of Eq. (2)

$$\left(\text{i.e.,} \sum_{l,\sigma} U_l d_{l,\sigma}^\dagger d_{l,\sigma} d_{l,-\sigma}^\dagger d_{l,-\sigma} \text{ and } \frac{U_{dc}}{N_{QD}} \sum_{l,p,p',\sigma} c_{p,\lambda}^\dagger c_{p',\lambda} e^{i(p-p')\cdot R_l} d_{l,\sigma,\lambda}^\dagger d_{l,\sigma}\right)$$

involve $U_l = U$ and $U_{dc}$, which denote, respectively, an on-site repulsive Coulomb energy in the $p_z$ orbital 208 of a particular quantum dot 104 located at a site l in array 102 and a Coulomb interaction energy between $p_{x,y}$ orbitals 204, 206 and $p_z$ orbitals 208 of a quantum dot 104 in array 102. $N_{QD}$ denotes the number of quantum dots 104 in array 102. In Eq. (2), the focus is on the $p_z$ orbitals 208 of quantum dots 104 rather than the ground state orbitals because, in the range of applied bias considered, the ground state energy level of a quantum dot 104 is deeply below the Fermi levels of both bottom electrode 108 and top electrode 110 and electron tunneling from bottom electrode 108 to top electrode 110 (or vice versa) through the ground state of quantum dots 104 is therefore blocked. Carriers in the ground state of a quantum dot 104 merely cause a constant shift to all the p orbitals 204, 206, 208 of the quantum dot 104.

Eq. (2) is the same as the Falicov-Kimball (FK) model if the self energy term, $U(N_c - N_\lambda)$, is neglected. The FK model has been used extensively to study the semiconductor-metal transition in transition metals and to study rare-earth oxides containing both localized and delocalized orbitals. The total number of carriers in localized orbitals and delocalized orbitals is conserved in the FK model. However, in the case of quantum dot memory cell 100, the total number of carriers (i.e., electrons) is not conserved, as carriers can be injected from and allowed to tunnel out of quantum dots 104 through bottom electrode 108 and top electrode 110.

Using Keldysh's Green's function technique, a tunneling current $J_{l,\sigma}$ through a quantum dot 104 at site l in array 102 is expressed as $$J_{l,\sigma} = \frac{-e}{\hbar} \int \frac{d\varepsilon}{\pi} [f_L(\varepsilon) - f_R(\varepsilon)] \frac{\Gamma_{l,L}\Gamma_{l,R}}{\Gamma_{l,L} + \Gamma_{l,R}} \text{Im} G_{l,l}^r(\varepsilon), \quad (3)$$

where $f_L = f(\in -\mu_L)$ and $f_R = f(\in -\mu_R)$ are Fermi distribution functions for bottom electrode 108 and top electrode 110, respectively, and $\mu_L$ and $\mu_R$ represent a chemical potential of bottom electrode 108 and top electrode 110, parameters which are determined by the composition of the electrodes. The chemical potential difference between bottom electrode 108 and top electrode 110 is related to applied bias $V_a$ by $\mu_L - \mu_R = eV_a$. The electron charge is represented by e and Planck's constant is represented by h. $\Gamma_{l,L}(\in)$ and $\in_{l,R}(\in)$ denote tunneling rates from $p_z$ orbitals 208 of quantum dots 104 to bottom electrode 108 and top electrode 110, respectively, where $$\Gamma_{l,\beta} = 2\pi \sum_k |V_{l,\beta,k}|^2 \delta(\varepsilon - \varepsilon_k).$$

In the wide-band limit, tunneling rates $\in_{l,L}(\in)$ and $\in_{l,R}(\in)$ are approximately energy-independent. Therefore, the calculation of the tunneling current $J_{l,\sigma}$ is entirely determined by the spectral function $A = \text{Im} G_{l,l}^r(\in)$, which is the imaginary part of the retarded Green's function $G_{l,l}^r(\in)$.

Using the equation of motion for $G_{l,l}^r(\in)$, the following expressions are obtained:

$$(\varepsilon - E_p + i\Gamma)G_{i,j}^r(\varepsilon) = \quad (4)$$
$$\delta_{i,j} + U\langle n_{i,-\sigma} d_{i,\sigma} d_{j,\sigma}^\dagger\rangle + \sum_{p'',p',\sigma} g_{p'',p'} \langle c_{p'',\sigma'}^\dagger c_{p',\sigma'} d_{i,\sigma} d_{j,\sigma}^\dagger\rangle,$$

$$(\varepsilon - E_p + i\Gamma)G_{i,p}^r(\varepsilon) = \quad (5)$$
$$U\langle n_{i,-\sigma} d_{i,\sigma} c_{p,\sigma}^\dagger\rangle + \sum_{p'',p',\sigma} g_{p'',p'} \langle c_{p'',\sigma'}^\dagger c_{p',\sigma'} d_{i,\sigma} c_{p,\sigma}^\dagger\rangle,$$

$$(\varepsilon - \varepsilon_{p',\lambda} - U(N_c - N_\lambda))G_{p',p}^r(\varepsilon) = \quad (6)$$
$$\delta_{p',p} + \sum_{i,p'',\sigma} g_{p'',p'} \langle (n_{i,\uparrow} + n_{i,\downarrow}) d_{p'',\sigma} c_{p,\sigma}^\dagger\rangle,$$

and $$(\varepsilon - \varepsilon_{p',\lambda} - U(N_c - N_\lambda))G_{p',j}^r(\varepsilon) = \quad (7)$$
$$\delta_{p',p} + \sum_{i,p'',\sigma} g_{p'',p'} \langle (n_{i,\uparrow} + n_{i,\downarrow}) d_{p'',\sigma} d_{j,\sigma}^\dagger\rangle.$$

Here, $$\Gamma = (\Gamma_{l,L} + \Gamma_{l,R})/2 \text{ and } g_{p,p'} = \frac{U_{dc}}{N} e^{i(p-p')\cdot R_i}.$$

In Eqs. (4)-(7), four one-particle Green's functions have been introduced: $G_{i,j}^r(\in) = \langle d_{i,\sigma} d_{j,\sigma}^\ddagger\rangle$, $G_{i,p}^r(\in) = \langle d_{i,\sigma} c_{p,\sigma}^\ddagger\rangle$, $G_{p',p}^r(\in) = \langle c_{p',\sigma} c_{p,\sigma}^\ddagger\rangle$, and $G_{p',j}^r(\in) = \langle c_{p',\sigma} d_{j,\sigma}^\ddagger\rangle$. These four one-particle Green's functions are coupled with two-particle Green's functions via U and $U_{dc}$. The equation of motion for the two-particle Green's function (defined as $\langle n_{i,-\sigma} d_{i,\sigma} d_{j,\sigma}^\ddagger\rangle$, $\langle n_{i,-\sigma} d_{i,\sigma} c_{p,\sigma}^\ddagger\rangle$, $\langle c_{p'',\sigma'} c_{p',\sigma'} d_{i,\sigma} d_{j,\sigma}^\ddagger\rangle$, $\langle c_{p'',\sigma}^\ddagger c_{p',\sigma} d_{i,\sigma} c_{p,\sigma}^\ddagger\rangle$, $\langle (n_{i,\uparrow} + n_{i,\downarrow}) d_{p'',\sigma} c_{p,\sigma}^\ddagger\rangle$, and $\langle (n_{i,\uparrow} + n_{i,\downarrow}) d_{p'',\sigma} d_{j,\sigma}^\ddagger\rangle$) are coupled to three-particle Green's functions. In order to terminate this hierarchy of equations of motion, the Hartree-Fock approximation method is used to decouple terms involving $U_{dc}$. Meanwhile, in the calculations for $\langle n_{i,-\sigma} d_{i,\sigma} d_{j,\sigma}^\ddagger\rangle$ and $\langle n_{i,-\sigma} d_{i,\sigma} c_{p,\sigma}^\ddagger\rangle$, the coupling terms between localized states and the bottom and top electrodes 108 and 110 are determined following a scheme described in "Tunneling Current Spectroscopy of a Nanostructure Junction Involving Multiple Energy Levels," published in Physical Review Letters, vol. 99, article 086803; and "Theory of charge transport in a quantum dot tunnel junction with multiple energy levels," published in Physical Review B, vol. 77, article 245412, both of which are incorporated herein by reference, which scheme is valid for a regime in which Coulomb blockade occurs.

Solving Eqs. (4)-(7), the following is obtained:

$$G_{p,p',\lambda}^r(\varepsilon) = \frac{\delta_{p,p'}}{\varepsilon - \varepsilon_p - \Delta_\lambda}, \quad (8)$$

where $\Delta_\lambda = U_{dc}(N_{d,\sigma} + N_{d,-\sigma}) + U(N_c - N_\lambda)$ and $$G_{l,l}^r(\varepsilon) = \frac{1 - N_{d,-\sigma}}{\varepsilon - E_p - \Delta_c + i\Gamma} + \frac{N_{d,-\sigma}}{\varepsilon - E_p - U - \Delta_c + i\Gamma}, \quad (9)$$

where $\Delta_c = U_{dc} N_c$ denotes the self energy of a quantum dot 104 due to the Coulomb interaction of the local orbital of the quantum dot with the band and where $N_d$ is the occupation number of $p_z$ orbitals 208 in each unit cell 202 in array 102.

To reveal the tunneling current behavior across quantum dot memory cell 100, the occupation numbers $N_{d,\sigma}$ and $N_c$ are solved self-consistently by the following equations:

$$N_{d,\sigma} = -\int \frac{d\varepsilon}{\pi} \frac{\Gamma_L f_L(\varepsilon) + \Gamma_R f_R(\varepsilon)}{\Gamma_L + \Gamma_R} \mathrm{Im} G^r_{l,l}(\varepsilon) \tag{10}$$

and $$N_c = -\sum_{p,\lambda} \int \frac{d\varepsilon}{\pi} \frac{\Gamma_{L,c} f_L(\varepsilon) + \Gamma_{R,c} f_R(\varepsilon)}{\Gamma_{L,c} + \Gamma_{R,c}} \mathrm{Im} G^r_{p\lambda,p\lambda}(\varepsilon)/N_{QD}, \tag{11}$$

where $G_{p\lambda,p\lambda}^r(\in)=1/(\in-\in_{p,\lambda}-U(N_c-N_\lambda)-U_{dc}(N_{d,\uparrow}+N_{d,\leftarrow})+i(\Gamma_{L,c}+\Gamma_{R,c})/2)$. As mentioned above, the coupling between the bottom and top electrodes 108 and 110 and the $p_{x,y}$ orbitals 208 of array 102 of quantum dots 104 is negligible (i.e., $\Gamma_c=(\Gamma_{L,c}+\Gamma_{R,c})/2$), where $\Gamma_{L,c}(\Gamma_{R,c})$ denotes the tunneling between the bottom (top) electrode 108 (110) and the $p_{x,y}$ orbitals, is small). Therefore, the imaginary part of Eq. (8) can be written as $\mathrm{Im} G_{p\lambda,p\lambda}^r(\in) \approx \pi\delta(\in-\in_{p,\lambda}-U(N_c-N_\lambda)-U_{dc}(N_{d,\uparrow}+N_{d,\downarrow}))$.

The range of applied bias used for the operation of quantum dot memory cell 100 is not sufficient to overcome the charging energy of $U+\Delta_c$. Thus, the second term in Eq. (9) is ignored, giving $G_{l,l}^r(\in)=(1-N_{d,-\sigma})/(\in-E_p-\Delta_c+i\Gamma)$. The occupation numbers at zero temperature are then calculated by $$N_{d,\sigma} = \tag{12}$$
$$\frac{(1-N_{d,-\sigma})}{\pi} \frac{\Gamma_L}{\Gamma_L+\Gamma_R} \int_{-\infty}^{E_F+eV_a} d\varepsilon \frac{\Gamma}{(\varepsilon - E_p - \alpha eV_a - \Delta_c)^2 + \Gamma^2}$$

or $$\frac{\Gamma_L}{\Gamma_L+\Gamma_R} N_d/(1-N_d) = \frac{1}{\pi}\cot^{-1}\left(\frac{E_F + eV_a - E_p - \alpha eV_a - U_{dc}N_c}{\Gamma}\right), \tag{13}$$

in which the $\alpha eV_a$, term arises from the applied bias across quantum dot memory cell 100, where $\alpha$ is a dimensionless scaling factor determined by the environment of quantum dot memory cell 100, and $$N_\lambda = \frac{\Gamma_{L,c}}{\Gamma_{L,c}+\Gamma_{R,c}} \int_{-\infty}^{E_F+eV_a} d\varepsilon D_\lambda(\varepsilon - U_{dc}(N_{d,\uparrow}+N_{d,\downarrow}) - U(N_c - N_\lambda), \tag{14}$$

where $$D_\lambda(\varepsilon) = \sum_p \delta(\varepsilon - \varepsilon_{p,\lambda})/N_{QD}$$

denotes the density of states (DOS) per unit cell 202 of the λth conduction band. These equations are solved given the following features of quantum dot memory cell 100: (1) The energy level of $p_z$ orbital 208 is always above the Fermi energy $E_F$ of top electrode 110 (in the range of bias considered). Thus, the electron injection from right electrode 110 can be ignored in Eqs. (12) and (14). (2) The Hamiltonian is spin independent, such that the occupation numbers for spin-up and spin-down states are equivalent in Eqs. (11), (13), and (14). That is, $N_{d,\uparrow}=N_{d,\downarrow}$.

In the simple case of a square lattice in which $N_x=N_y$, the DOS is approximated by a square pulse function $$D_x(\in)=D_y(\in)=1/W \text{ for } E_b \in < E_b + W, \tag{15}$$

where $E_b$ denotes the bottom of the conduction band of array 102 and W is the bandwidth of the conduction band. Such an approximation allows Eq. (11) to have a simple analytic solution of the form $$N_\lambda = g - cN_d, \tag{16}$$

with $g=[E_F+(1-\alpha)eV_a-E_b]/(\gamma W+3U)$ and $c=2U_{dc}/(\gamma W+3U)$, where $\gamma=(\Gamma_{L,c}+\Gamma_{R,c})/\Gamma_{L,c}$. Substituting this expression into Eq. (13) gives rise to a simple transcendental equation which can be solved numerically. The resulting equation generates a maximum of three roots, of which only two are stable.

For a more realistic DOS derived using a 2-D tight-binding model, the coupled transcendental equations given in Eqs. (13) and (14) are solved numerically. The tight-binding model assumes that $p_{x,y}$ orbitals 204, 206 are arranged on a rectangular lattice having lattice constants a and b. With this model, the band structure for the $p_x$ band of array 102 is given by $$E_x(k)=E_p-2\upsilon_l\cos(k_x a)-2\upsilon_t\cos(k_y b), \tag{17}$$

where $\upsilon_l$ denotes the (ppσ) interaction within the band and $\upsilon_t$ denotes the (ppπ) interaction within the band. For the $p_y$ band, the band structure is given by $$E_y(k)=E_p-2\upsilon_l'\cos(k_y b)-2\upsilon_t'\cos(k_x a). \tag{18}$$

The DOS per unit cell 202 for the $p_x$ band, for $\upsilon_l > \upsilon_t$, is given by $$D_x(\varepsilon) = \begin{cases} \frac{1}{\pi^2}\int_0^\pi d\eta \left[(2\upsilon_l)^2 - \left(\begin{array}{c}2\upsilon_t + \\ 2\upsilon_t(1-\cos\eta)-\tilde\varepsilon\end{array}\right)^2\right]^{-1/2} & \theta(\tilde\varepsilon - 2\upsilon_t(1-\cos\eta)) \text{ for } 0 < \tilde\varepsilon < 4\upsilon_t \\ \frac{1}{\pi^2}\int_0^\pi d\eta \left[(2\upsilon_l)^2 - \left(\begin{array}{c}\tilde\varepsilon - 2\upsilon_t - \\ 2\upsilon_t(1-\cos\eta)\end{array}\right)^2\right]^{-1/2} & \theta(\tilde\varepsilon - 2\upsilon_t(1-\cos\eta)) \text{ for } 4\upsilon_t < \tilde\varepsilon < 4\upsilon_l \\ \frac{1}{\pi^2}\int_0^\pi d\eta \left[(2\upsilon_l)^2 - \left(\begin{array}{c}2\upsilon_t + \\ 2\upsilon_t(1+\cos\eta)-\tilde\varepsilon\end{array}\right)^2\right]^{-1/2} & \theta(\bar\varepsilon - 2\upsilon_t(1+\cos\eta)) \text{ for } 0 < \bar\varepsilon < 4\upsilon_t, \end{cases} \tag{19}$$

where $\tilde{\in}=\in-E_p+2\upsilon_l+2\upsilon_t$ and $\overline{\in}=E_p+2\upsilon_l+2\upsilon_t-\in$. If $\upsilon_l<\upsilon_t$, then the roles of $\upsilon_l$ and $\upsilon_t$ are reversed in the expression for the density of states (i.e., Eq. (19)). The DOS described by Eq. (19) includes the van Hove singularities. A similar expression $D_y(\in)$ holds for the density of states of the $p_y$ band, with hopping parameters $\upsilon_l$ and $\upsilon_t=\upsilon_t'$ replaced by $\upsilon_l'=\upsilon_l$ and $\upsilon_t'$, respectively. By varying the hopping parameters $\upsilon_l$, $\upsilon_l'$, $\upsilon_t$, and $\upsilon_t'$ (e.g., by fixing lattice constant a and tuning lattice constant b, or vice versa), the behavior of the bistable tunneling current through quantum dot memory cell 100 can be studied for both one-dimensional systems and two-dimensional systems.

In general, a bistable tunneling current across quantum dot memory cell 100 is due to charge swapping between a layer with extended states (i.e., bottom electrode 108 or top electrode 110) and a layer having localized states (i.e., array 102 of quantum dots 104). The interplay of on-site Coulomb interactions between $p_z$ orbitals and the delocalized nature of conduction band states derived from the hybridization of $p_{x,y}$ orbitals gives rise to bistability. The model presented herein is valid in a regime defined by 4W>U.

As an example of the application of the approach described above, the coupled nonlinear equations given in Eqs. (13) and (14) are solved numerically using the following parameters: $U_{de}=U=50$ meV, $\Gamma_L=1$ meV ($\Gamma_{L,c}=\Gamma_L/10$), and $\Gamma_R=1$ meV ($\Gamma_{R,c}=\Gamma_L/10$). In general, the following parameters are used throughout the calculations presented herein: T=0K, $\upsilon_t'=5$ meV, $\upsilon_l=20$ meV, $\alpha=0.5$, and $E_F+V_0=E_p$, where $V_0$ is a reference bias for $V_a$. The calculations and method presented herein are not bound to these parameters and apply to any quantum dot memory cell described by the equations presented above. The tight-binding parameters used in solving the above equations are assumed to scale according to $1/R^2$, where R is the separation between two quantum dots 104 in array 102. Thus, $\upsilon_l'=\upsilon_l(a/b)^2$ and $\upsilon_t=\upsilon_t'(a/b)^2$. When a=b, the square lattice case is obtained.

Figure 3A:
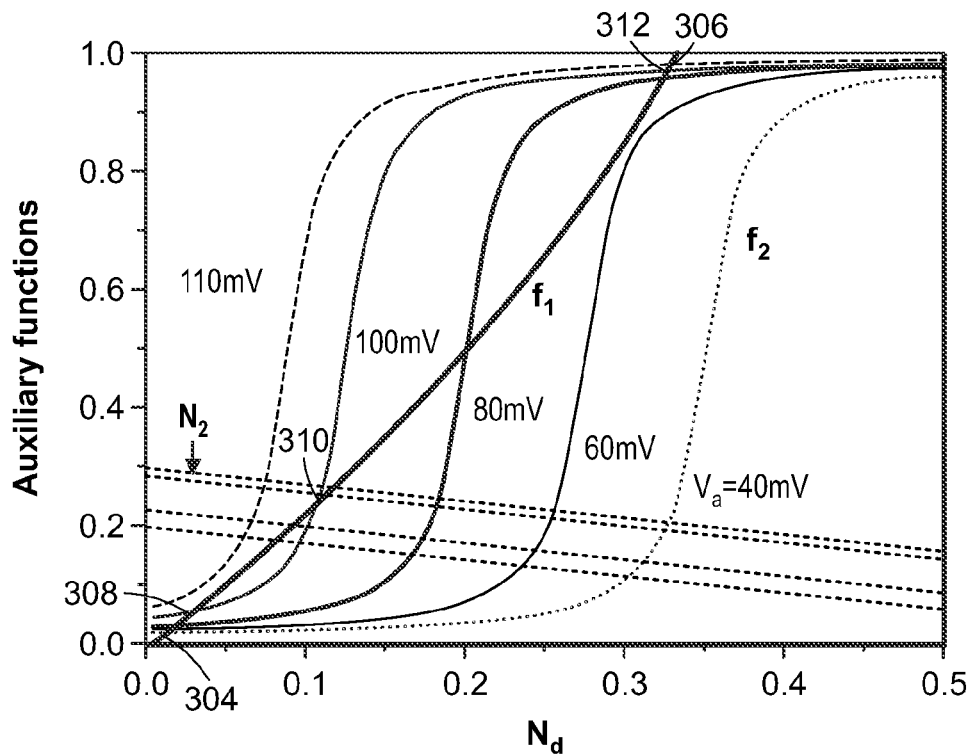
FIGS. 3A and 3B are plots of auxiliary functions as a function of an occupation number of a quantum dot for various values of a bias applied to a quantum dot memory cell.
Figure 3B:
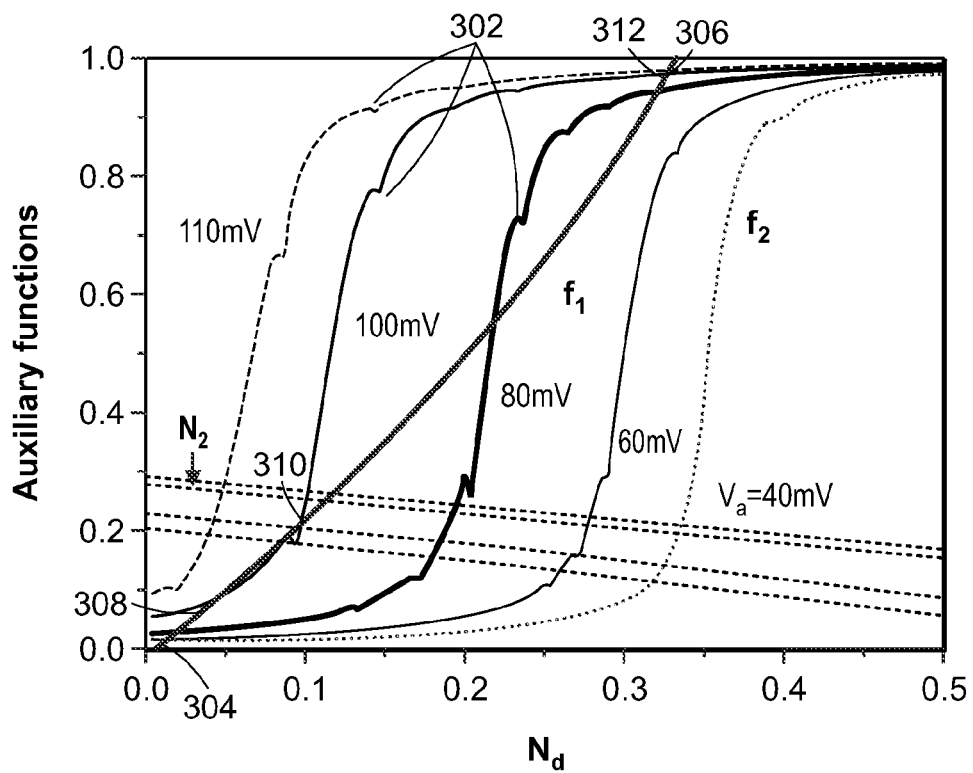

Referring to FIGS. 3A and 3B, the auxiliary functions $$f_1 = \frac{\Gamma_L+\Gamma_R}{\Gamma_L}N_d/(1-N_d)$$

and $f_2$, which are the left-hand side and the right-hand side, respectively, of Eq. (13), are plotted versus $N_d$, the occupation number of $p_z$ orbitals of quantum dots 104, for various values of the applied bias $V_a$. The results obtained using a constant DOS and a realistic DOS (i.e., using a tight-binding model) are shown in FIG. 3A and FIG. 3B, respectively. The two sets of curves are similar, except that the results in FIG. 3B obtained using a realistic DOS contain sharp features 302 caused by van Hove singularities in the density of states. The occupation number per spin component in a given conduction band, $N_\lambda$ as a function of $N_d$ is also shown in both FIG. 3A and FIG. 3B.

The intersection of $f_1$ and $f_2$ in FIG. 3 gives the solution to $N_d$. For low applied bias, only one root 304 to the equation $f_1=f_2$ exists. Similarly, for high applied bias, only one root 306 exists to the equation $f_1=f_2$. At moderate bias (in this example, for an applied bias between about 80 mV and 100 mV), three roots exist to the equation $f_1=f_2$. For instance, for an applied bias of 100 mV, the equation $f_1=f_2$ is solved by three roots: a first root 308, a second root 310, and a third root 312. Root 310 is an unstable solution; roots 308 and 312 are stable. The occupation number $N_\lambda$ is also plotted as a function of $N_d$ for various values of applied bias. Although van Hove singularities in the tight-binding density of states give rise to sharp features 302 in the plots of $f_2$ in FIG. 3B, the structure of $N_\lambda$ does not exhibit abnormal features. This is because the $p_z$ orbitals 208 of each quantum dot 104 are correlated with the $p_{x,y}$ orbitals 204, 206 of the array 102 of quantum dots 104 via $N_c$, which is related to the integral over the density of states. This result remains similar if the constant density of states approximation is used (as described in Eqs. (15) and (16)) with the same bandwidth, $W=4(\upsilon_l+\upsilon_t)$.

Figure 4:
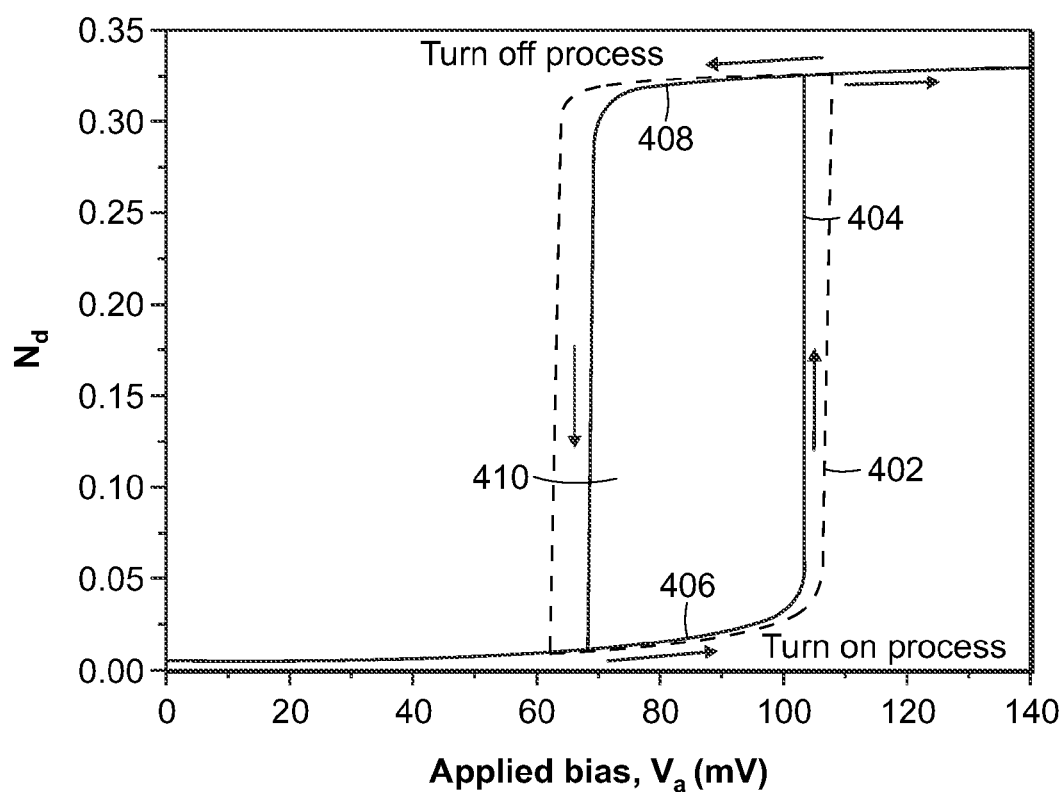
FIG. 4 is a plot of an occupation number of a quantum dot as a function of a bias applied to a quantum dot memory cell.

Referring to FIG. 4, the occupation number, $N_d$, is plotted as a function of applied bias $V_a$ at zero temperature for a constant DOS as a curve 402 and for a realistic DOS using the tight-binding model as a curve 404. In both cases, array 102 of quantum dots is assumed to be a square lattice (i.e., a=b); other parameters are the same as those of FIGS. 3A and 3B. It is evident from this graph that the occupation number has bistable roots 406, 408; that is, for a range of applied bias $V_a$, a hysteresis region 410 exists in which two occupation numbers $N_d$ are obtained. The fact that bistable roots are obtained using both a constant DOS and a more realistic DOS indicates that the hysteresis behavior of quantum dot memory cell 100 is not sensitive to the detailed shape of the band structure or the density of states of array 102 of quantum dots.

Once the occupation numbers are solved, the tunneling current is obtained by the relation $$J = \frac{e}{\hbar}\Gamma_R N_d \equiv J_0 N_d,$$

which is valid at zero temperature and when the carrier injection from top electrode 110 can be ignored. Consequently, the curve for $N_d$ versus applied bias shown in FIG. 4 also illustrates the tunneling current across quantum dot memory cell 100. In the range of bias where multiple roots are allowed (i.e., in hysteresis region 410), turn-on and turn-off tunneling currents are determined by selecting either root 406 or root 408, depending on the value of the tunneling current corresponding to the previous value of $V_a$.

Figure 5A:
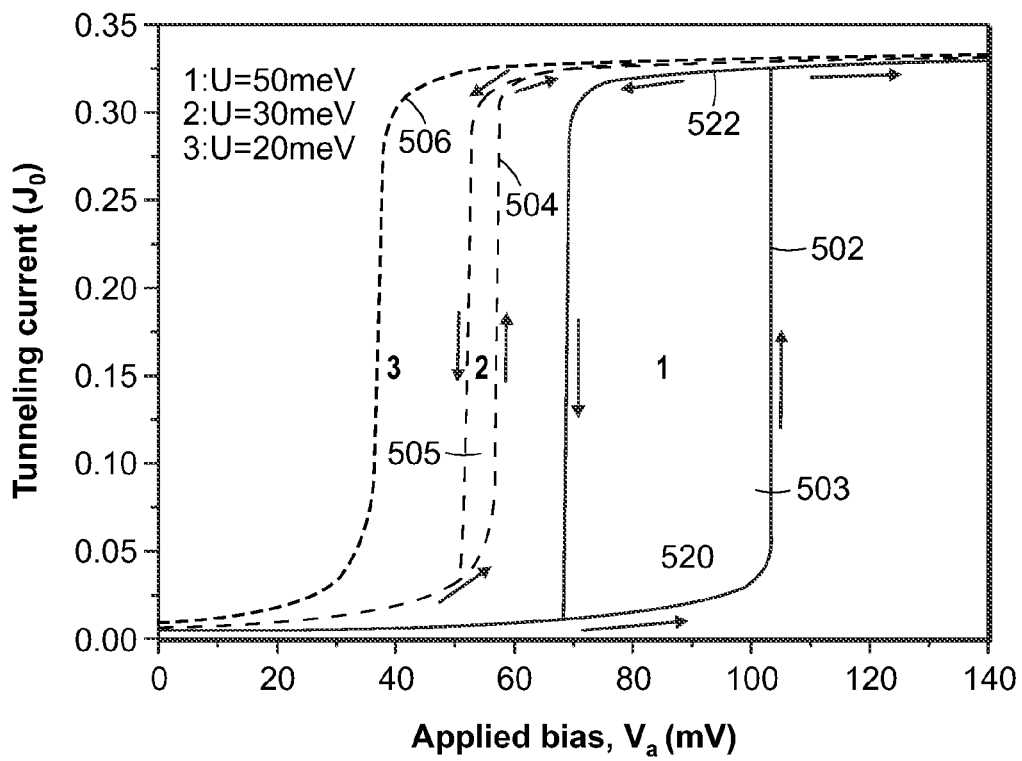
FIG. 5A is a plot of a tunneling current across a quantum dot memory cell as a function of a bias applied to the memory cell for various values of a Coulomb interaction in a quantum dot of the memory cell.

As the applied bias is turned on or off, the quantum dot memory cell selects the high conductivity state (larger $N_d$) or the low conductivity state (smaller $N_d$). Referring to FIG. 5A, the tunneling current through quantum dot memory cell 100 is plotted as a function of applied bias for various strengths of $U_{dc}$, the Coulomb interaction within a quantum dot 104. The tunneling current is in units of $J_0=e\Gamma_R/h$. Other parameters are the same as the parameters for FIGS. 3A, 3B, and 4. Curves 502, 504, and 506 correspond to values of $U_{dc}$ of 50 meV, 30 meV, and 20 meV, respectively. The size of quantum dots 104 affects the value of $U_{dc}$; smaller quantum dots have a stronger Coulomb interaction and thus have larger values of $U_{dc}$. Curves 502 and 504 exhibit hysteresis regions 503 and 505, respectively, in which two tunneling currents are supported. For instance, curve 502 supports two tunneling currents 520 and 522. For weak Coulomb interactions (i.e., small values of $U_{dc}$ as shown in curve 506), the bistable current vanishes. A large value of $U_{dc}$ causes the bistability to be more robust against changes in temperature and broadening due to stray fields.

The critical level of Coulomb interaction needed to maintain a bistable current across the quantum dot memory cell depends on physical parameters of the quantum dot memory cell. These physical parameters include, for instance, tunneling rates between array 102 of quantum dots 104 and electrodes 108 and 110, temperature, bandwidth of the two-dimensional conduction band of array 102 of quantum dots, and charging energy of quantum dots 104. Although the calculations presented herein were performed at a temperature of 0 K, the bistable behavior of quantum dot memory cell 100 is maintained at higher temperatures, e.g., at room temperature, provided a charging energy of quantum dots 104 is sufficiently large (i.e., quantum dots 104 are sufficiently small) so as to overcome the thermal energy. The bistable current through the quantum dot memory cell does not exhibit negative differential conductivity, in contrast to bistable current through quantum well systems, which typically display negative differential conductivity.

Figure 5B:
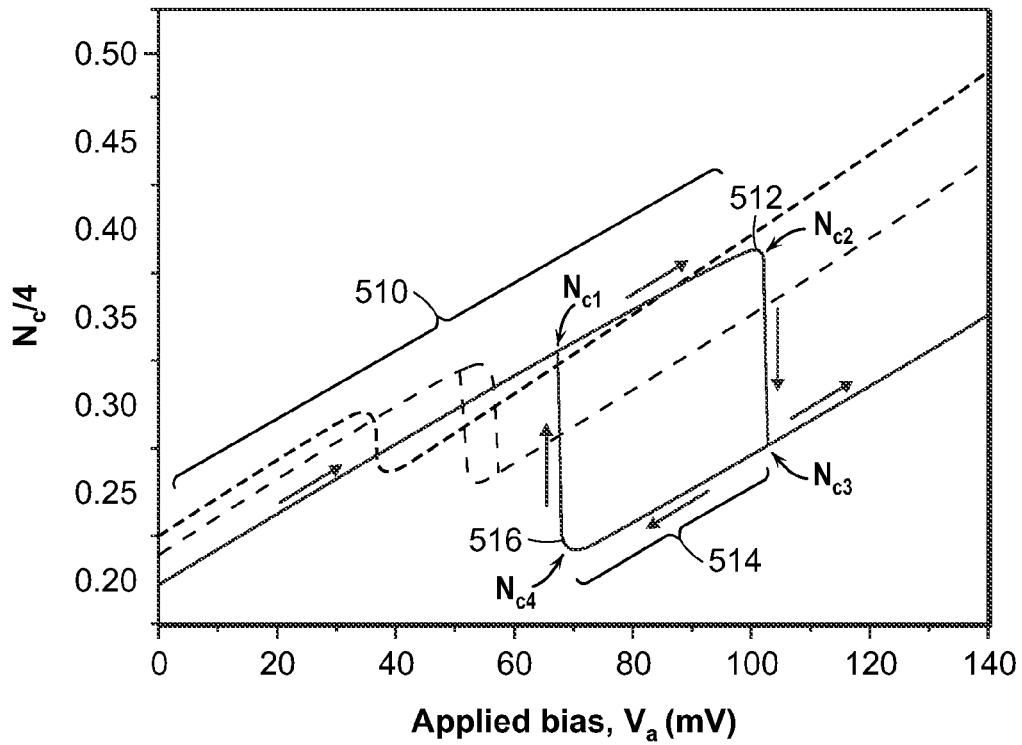
FIG. 5B is a plot of an occupation number of a quantum dot as a function of a bias applied to a quantum dot memory cell for various values of a Coulomb interaction in the quantum dot.

Referring to FIG. 5B, the behavior of $N_c/4$, the total occupation number per unit cell 202 of the conduction band of array 102, is shown as a function of applied bias for the same set of Coulomb interaction strengths shown in FIG. 5A. Understanding the behavior of $N_c$ is useful for clarifying the bistable behavior of $N_d$ in the quantum dot memory cell. During the "turn-on" process, as the Fermi level in bottom electrode 108 is gradually raised from below the resonance level $E_p$ (as shown in a region 510), the allowed solution to the occupation number $N_d$ remains small (i.e., corresponding to tunneling current 520 in FIG. 5A) as a result of inter-level Coulomb blockade, and the energy of $p_z$ orbitals 208 in array 102 of quantum dots is raised by an amount $N_c U_{dc}$, where the two-dimensional conduction band occupation number $N_c$ is appreciable. Once the applied bias $V_a$ reaches a critical value at which the inter-level Coulomb blockade is overcome (at a point 512), $N_d$ increases quickly to a value around ⅓ (i.e., corresponding to tunneling current 522 in FIG. 5A). At this point, charges accumulate in the localized $p_z$ orbitals 208 of quantum dots 102, leading to an increase of the self-energy of the conduction band states of array 102 by an amount $2U_{dc}N_d$, hence reducing $N_c$ to a much smaller value (i.e., reducing $N_c$ from $N_{c2}$ to $N_{c3}$). This reduction in $N_c$ in turn causes the energy of $p_z$ orbitals 208 to decrease during the "turn-off" process (region 514) while $N_d$ remains around ⅓ in order to keep the transcendental equation self-consistent. When the applied bias $V_a$ reaches a lower critical value (at a point 516), $N_c$ switches from $N_{c4}$ to $N_{c1}$ and $N_d$ rapidly returns to the lower value (i.e., corresponding to tunneling current 520), which becomes the only self-consistent solution to the transcendental equation.

FIG. 5B demonstrates that bistable tunneling current arises from the repulsive Coulomb interactions $U_{dc}$ within quantum dots 104. That is, the bistable tunneling current is due to an interplay of a Coulomb blockade effect for localized states of individual quantum dots 104 with the self-energy correction to the delocalized 2-D conduction band states formed by hybridized $p_{x,y}$ orbitals in array 102 of quantum dots. In polaron models, a bistable behavior arises from an attractive potential having the form $$\frac{-2\lambda_p^2}{w_0} d_{l,\sigma}^\dagger d_{l,\sigma} d_{l,-\sigma}^\dagger d_{l,-\sigma},$$

where $\lambda_p$ and $W_0$ are an electron-phonon interaction strength and a phonon frequency, respectively. When the intralevel Coulomb interaction is contained within a single quantum dot (or, similarly, within a single molecule), the attractive potential giving rise to the bistable behavior is written as $$\left(U - \frac{-2\lambda_p^2}{w_0}\right) d_{l,\sigma}^\dagger d_{l,\sigma} d_{l,-\sigma}^\dagger d_{l,-\sigma}.$$

Due to the large repulsive Coulomb interaction U, a net attractive electron-electron interaction mediated by phonons is difficult to achieve, which difficulty may explain why a bistable tunneling current through a single quantum dot junction has not yet been observed.

Figure 6:
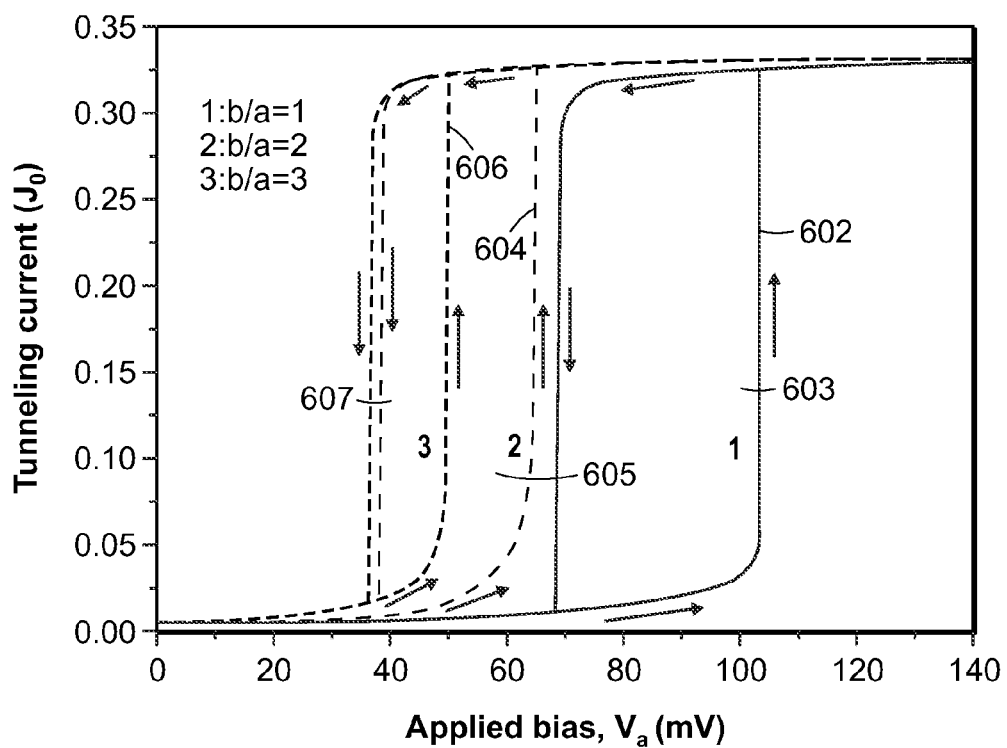
FIG. 6 is a plot of a tunneling current across a quantum dot memory cell as a function of a bias applied to the memory cell for various arrangements of an array of quantum dots in the memory cell.

Referring to FIG. 6, the tunneling current through the $p_z$ orbitals 208 of quantum dots 104 is shown as a function of applied bias for various ratios of b/a, which are the lattice constants for array 102 of quantum dots 104 as shown in FIGS. 2A and 2B. Other parameters are the same as those for FIG. 4. As the b/a ratio increases, the array 102 of quantum dots 104 in memory cell 100 approaches a one-dimensional (1-D) limit. Other parameters are the same as those used in the determination of the curves of FIG. 4. For a b/a ratio of 1 (shown as a curve 602), a b/a ratio of 2 (shown as a curve 604), and a b/a ratio of 3 (shown as a curve 606), the bistable behavior of the quantum dot memory cell is sustained. For b/a=1, a hysteresis region 603 is present; for b/a=2, a hysteresis region 605 is present; and for b/a=3, a hysteresis region 607 is present. However, the bistability becomes weaker and the hysteresis region becomes smaller as the 1-D limit is approached (i.e., as the b/a ratio increases). That is, hysteresis region 603 is larger in area than hysteresis region 605, which region is larger than hysteresis region 607. When the b/a ratio is greater than 3, the bistable current behaves essentially in the same manner as shown for the b/a=3 situation 606. Thus, b/a≈3 sufficiently represents a 1-D quantum dot memory cell capable of supporting a bistable current in a range of applied bias. However, approaching the limit of isolated quantum dots (i.e., as the bandwidth of the conduction band of array 102 decreases), the bistability disappears. Bistable current in 1-D quantum dot arrays is essential for the realization of high density nanoscale memory structures.

For a one-dimensional quantum dot memory cell, taking a=3 nm and b=9 nm (i.e., b/a=3) and considering 50 quantum dots 104 in order to establish a band-like behavior, the density of the quantum dot memory device is around $1/1350$ nm$^2$≈0.5 TB/in$^2$, which is significantly higher than the density of existing nonvolatile memory devices. A 1-D quantum dot memory cell is useful for specialized applications, such as an aligned memory. A 2-D memory is more generally applicable, however. For instance, a 2-D quantum dot memory with cells arranged in a checkerboard-like pattern is useful for dynamic random access memory (DRAM) applications. If 50 quantum dots were arranged in a close-packed 2-D array (i.e., b/a=1), the band-like behavior for the $p_{x,y}$ states of the array would remain, thus increasing the memory density of the quantum dot memory cell by a factor greater than two.

Figure 7:
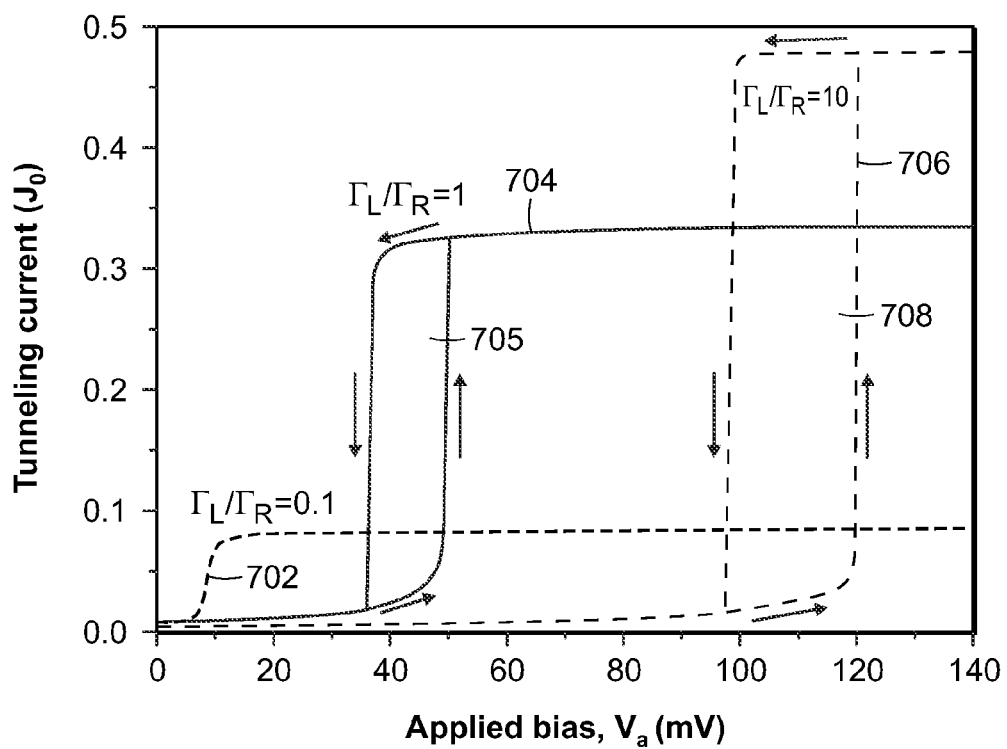
FIG. 7 is a plot of a tunneling current across a quantum dot memory cell as a function of a bias applied to the memory cell for various tunneling rate ratios through the memory cell.

Referring to FIG. 7, the tunneling current across quantum dot memory cell 100 is shown as a function of applied bias for various tunneling rate ratios $\Gamma_L/\Gamma_R$ for the one dimensional limit (b/a=3), where $\Gamma_L$ is the tunneling rate between bottom electrode 108 and array 102 of quantum dots and $\Gamma_R$ is the tunneling rate between array 102 of quantum dots and top electrode 110. Other parameters are the same as those for FIG. 4. For a symmetrical quantum dot memory cell with $\Gamma_L/\Gamma_R=1$, the tunneling current is shown in curve 704, which displays a hysteresis region 705. When $\Gamma_L$ is larger than $\Gamma_R$, such as shown in curve 706 for $\Gamma_L=1$ meV and $\Gamma_R=0.1$ meV (i.e., a shell-filling condition), the effect of $U_{dc}$ is enhanced, leading to a larger hysteresis region 708 and a wider voltage range for bistable current. Conversely, the bistability behavior disappears for $\Gamma_L=0.1$ meV and $\Gamma_R=1$ meV (i.e., a shell-tunneling condition), as shown in curve 702, which does not have a hysteresis region. In the shell-tunneling condition, charges are unable to accumulate in $p_z$ orbitals 208 of quantum dots 104. Consequently, the effect of $U_{dc}$ is suppressed.

Thus, it is possible to control the bistable current by adjusting the ratio of incoming to outgoing tunneling rate (i.e., the ratio of the tunneling rate from bottom electrode 108 to array 102 to the tunneling rate from array 102 to top electrode 110).

It is to be understood that the foregoing description is intended to illustrate and not to limit the scope of the invention, which is defined by the scope of the appended claims. Other embodiments are within the scope of the following claims.

What is claimed is:

1. A method of making a quantum dot memory cell, the quantum dot memory cell including an array of quantum dots disposed between a first electrode and a second electrode, the method comprising:
    obtaining values for a tunneling current through the quantum dot memory cell as a function of a voltage applied to the quantum dot memory cell, the values for the tunneling current determined on the basis of a density of states of the array of quantum dots;
    selecting parameters of the quantum dot memory cell such that the tunneling current through the quantum dot memory cell exhibits a bistable current for at least some values of the voltage applied to the quantum dot memory cell.

2. The method of claim 1, wherein the quantum dot memory cell further includes a quantum well positioned between the array of quantum dots and the first electrode.

3. The method of claim 1, wherein the values for the tunneling current are obtained on the basis of a first tunneling rate between the array of quantum dots and the first electrode and a second tunneling rate between the array of quantum dots and the second electrode.

4. The method of claim 1, wherein the values for the tunneling current are obtained on the basis of a first Fermi distribution function of the first electrode and a second Fermi distribution function of the second electrode.

5. The method of claim 1, wherein the values for the tunneling current are obtained on the basis of a first occupation number of the array of quantum dots, the first occupation number representing a number of electrons in orbitals coupling the quantum dots to the first electrode and the second electrode.

6. The method of claim 5, wherein the orbitals coupling the quantum dots to the first electrode and the second electrode are localized around each quantum dot.

7. The method of claim 5, wherein the values for the tunneling current are obtained on the basis of a second occupation number of the array of quantum dots, the second occupation number representing a number of electrons in one of a plurality of energy levels in extended states of the array of quantum dots.

8. The method of claim 1, wherein the tunneling current arises at least in part due to charge swapping between localized states in the array of quantum dots and extended states in at least one of the first electrode and the second electrode.

9. The method of claim 1, wherein the parameters include a composition of the quantum dots.

10. The method of claim 1, wherein the parameters include a separation between adjacent quantum dots in the array of quantum dots.

11. The method of claim 1, wherein the parameters include a size of the quantum dots.

12. The method of claim 1, wherein the parameters include a number of quantum dots in the array of quantum dots.

13. The method of claim 1, wherein the parameters include a composition of a material in which the array of quantum dots is embedded.

14. The method of claim 1, wherein the parameters include a composition of the first electrode and a composition of the second electrode.

15. The method of claim 2, wherein the parameters include a composition of the quantum well.

16. The method of claim 2, wherein the values for the tunneling current are obtained on the basis of an occupation number of the quantum well, the occupation number of the quantum well representing a number of electrons in a subband of the quantum well.

17. The method of claim 1, wherein the quantum dot memory cell exhibits bistable current when the voltage applied to the quantum dot memory cell is less than about 100 mV.

18. The method of claim 1, wherein the quantum dot memory cell is capable of operating with a switching speed of about 1 Terahertz.

19. A quantum dot memory cell comprising:
    a first electrode;
    a second electrode; and
    an array of quantum dots disposed between the first electrode and the second electrode,
    parameters of the quantum dot memory cell selected such that a tunneling current through the quantum dot memory cell exhibits a bistable current for at least some values of a voltage applied across the quantum dot memory cell, the tunneling current determined on the basis of a density of states of the array of quantum dots.

20. The quantum dot memory cell of claim 19, further comprising a quantum well positioned between the array of quantum dots and the first electrode.

21. The quantum dot memory cell of claim 19, wherein the array of quantum dots includes at least 50 quantum dots.

22. The quantum dot memory cell of claim 19, wherein the array of quantum dots includes a single layer of quantum dots in substantially all regions of the array of quantum dots.

23. The quantum dot memory cell of claim 19, wherein the array of quantum dots is substantially two-dimensional.

24. The quantum dot memory cell of claim 19, wherein the array of quantum dots is substantially one-dimensional.

25. The quantum dot memory cell of claim 19, wherein the tunneling current arises at least in part due to charge swapping between localized states in the array of quantum dots and extended states in at least one of the first electrode and the second electrode.

26. The quantum dot memory cell of claim 19, wherein the quantum dot memory cell exhibits bistable current when the voltage applied to the quantum dot memory cell is less than about 100 mV.

27. The quantum dot memory cell of claim 19, wherein the quantum dot memory cell is capable of operating with a switching speed of about 1 Terahertz.

28. The quantum dot memory cell of claim 19, wherein the quantum dots comprise a semiconductor.

29. The quantum dot memory cell of claim 20, wherein the quantum well comprises a semiconductor.

* * * * *